United States Patent
Iwakiri

(10) Patent No.: US 7,864,523 B2
(45) Date of Patent: Jan. 4, 2011

(54) COOLING DEVICE FOR ACCOMMODATED PRINTED CIRCUIT BOARD IN A CHASSIS

(75) Inventor: Yoshihisa Iwakiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 139 days.

(21) Appl. No.: 12/412,593

(22) Filed: Mar. 27, 2009

(65) Prior Publication Data

US 2009/0244842 A1    Oct. 1, 2009

(30) Foreign Application Priority Data

Mar. 28, 2008    (JP) .............................. 2008-087529

(51) Int. Cl.
*H05K 7/20*    (2006.01)
*G06F 1/20*    (2006.01)

(52) U.S. Cl. .............................. 361/679.49; 361/679.5; 361/679.48; 361/679.46; 361/695

(58) Field of Classification Search ............ 361/679.46, 361/679.48, 679.49, 679.5, 683–686, 695, 361/687

See application file for complete search history.

(56) References Cited

U.S. PATENT DOCUMENTS

| | | | | |
|---|---|---|---|---|
| 5,333,097 A | * | 7/1994 | Christensen et al. | 361/685 |
| 5,414,591 A | * | 5/1995 | Kimura et al. | 361/695 |
| 5,619,486 A | * | 4/1997 | Uno et al. | 720/654 |
| 5,684,671 A | * | 11/1997 | Hobbs et al. | 361/683 |
| 5,816,673 A | * | 10/1998 | Sauer et al. | 312/223.2 |
| 5,822,184 A | * | 10/1998 | Rabinovitz | 361/685 |
| 5,971,804 A | * | 10/1999 | Gallagher et al. | 439/581 |
| 6,496,366 B1 | * | 12/2002 | Coglitore et al. | 361/687 |
| 6,525,935 B2 | * | 2/2003 | Casebolt | 361/687 |
| 6,563,706 B1 | * | 5/2003 | Strickler | 361/695 |
| 6,693,796 B2 | * | 2/2004 | Ives et al. | 361/685 |
| 6,957,291 B2 | * | 10/2005 | Moon et al. | 710/302 |
| 7,061,715 B2 | * | 6/2006 | Miyamoto et al. | 360/97.03 |
| 7,139,170 B2 | * | 11/2006 | Chikusa et al. | 361/695 |
| 2001/0046118 A1 | * | 11/2001 | Yamanashi et al. | 361/687 |
| 2002/0126449 A1 | * | 9/2002 | Casebolt | 361/687 |
| 2003/0048607 A1 | * | 3/2003 | Ives et al. | 361/695 |

FOREIGN PATENT DOCUMENTS

| | | | |
|---|---|---|---|
| JP | 04-015998 | | 1/1992 |
| JP | 11184570 A | * | 7/1999 |
| JP | 2000-40474 | | 2/2000 |
| JP | 2003-283171 | | 10/2003 |
| JP | 2006221215 A | * | 8/2006 |

* cited by examiner

*Primary Examiner*—Anatoly Vortman
(74) *Attorney, Agent, or Firm*—Staas & Halsey LLP

(57) ABSTRACT

A cooling device includes a chassis that partitions a first space, a second space, and a third space sandwiched between the first space and the second space, a printed circuit board accommodated in the chassis that extends from the first space to the second space while traversing the third space, a fan occupying the third space outside a predetermined space that produces an air flow from the first space toward the second space by rotation of a rotor blade, wherein the predetermined space is ensured between the printed circuit board and the fan in the third space and an air duct member that occupies the predetermined space to form a flow passage of the air flow from an intake port to an exhaust port on the printed circuit board, wherein the intake port is opened to the second space and the exhaust port is opened to the first space.

5 Claims, 5 Drawing Sheets

COOLING DEVICE FOR ACCOMMODATED PRINTED CIRCUIT BOARD IN A CHASSIS

CROSS-REFERENCE TO RELATED APPLICATIONS

This application is based upon and claims priority to prior Japanese Patent Application No. 2008-87529 filed on Mar. 28, 2008 in the Japan Patent Office, the entire contents of which are incorporated herein by reference.

FIELD

Various embodiments of the invention discussed herein relate to a cooling device that cools a printed circuit board while accommodating the printed circuit board in a chassis.

BACKGROUND

For example, a computer device such as a rack mount type server is well known. The computer device includes a front panel rising from a front end of a bottom plate and a rear panel rising from a rear end. In the computer device, a hollow is partitioned from the front panel toward the rear panel on the bottom plate. The printed circuit board is extended along the bottom plate in the hollow. In the hollow, an air flow is produced along a surface of the printed circuit board from the front panel toward the rear panel. Japanese Laid-open Patent Publication Nos. 4-15998, 2003-283171, and 2000-40474 discuss apparatuses wherein the air flow cools electronic parts mounted on the surface of the printed circuit board.

SUMMARY

A cooling device includes a chassis that partitions a first space, a second space, and a third space sandwiched between the first space and the second space, a printed circuit board accommodated in the chassis that extends from the first space to the second space while traversing the third space, a fan occupying the third space outside a predetermined space that produces an air flow from the first space toward the second space by rotation of a rotor blade, wherein the predetermined space is ensured between the printed circuit board and the fan in the third space and an air duct member that occupies the predetermined space to form a flow passage of the air flow from an intake port to an exhaust port on the printed circuit board, wherein the intake port is opened to the second space and the exhaust port is opened to the first space.

DESCRIPTION OF EMBODIMENTS

An embodiment of the invention will be described below with reference to the accompanying drawings.

Figure 1:
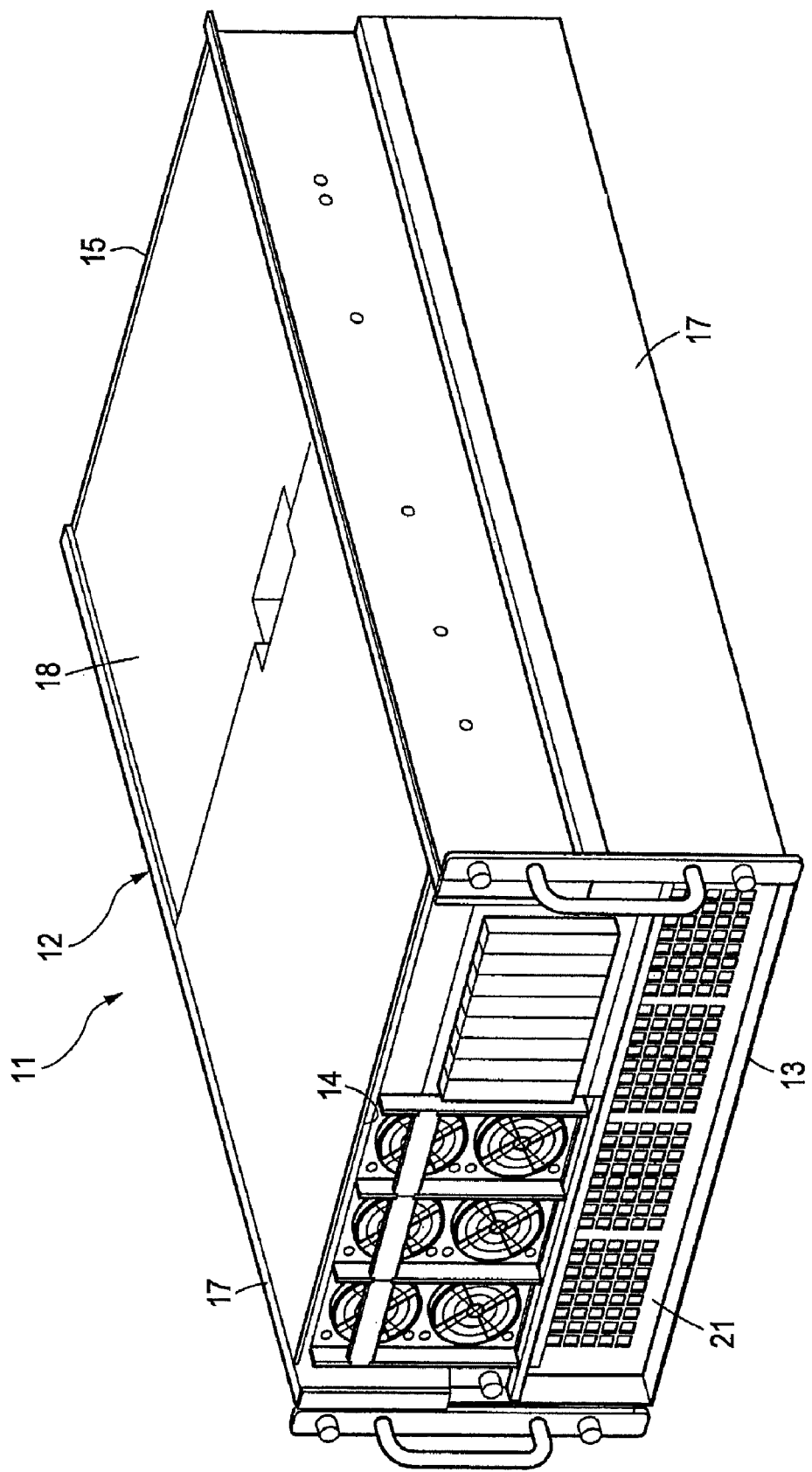
FIG. 1 is a perspective view depicting an appearance of a rack mount type computer device.

FIG. 1 depicts an appearance of a rack mount type computer device 11. The computer device 11 includes a chassis 12. The chassis 12 partitions a hollow extended from a front-side opening 14 toward a rear-side opening 15 on a rectangular bottom plate 13. The hollow is formed by a rectangular-solid space. The bottom plate 13 partitions a bottom surface of the rectangular-solid space. The front-side opening 14 and the rear-side opening 15 define a front face and a rear face of the rectangular-solid space. A pair of side faces of the rectangular-solid space is partitions by side plates 17. The side plates 17 extend from the front-side opening 14 to the rear-side opening 15 while facing each other. A lower end of the side plate 17 is connected to the bottom plate 13. A ceiling surface of the rectangular-solid space is partitioned by a ceiling plate 18. The ceiling plate 18 extends from the front-side opening 14 to the rear-side opening 15 while facing the bottom plate 13. The ceiling plate 18 may be partitioned in a longitudinal direction.

Figure 2:
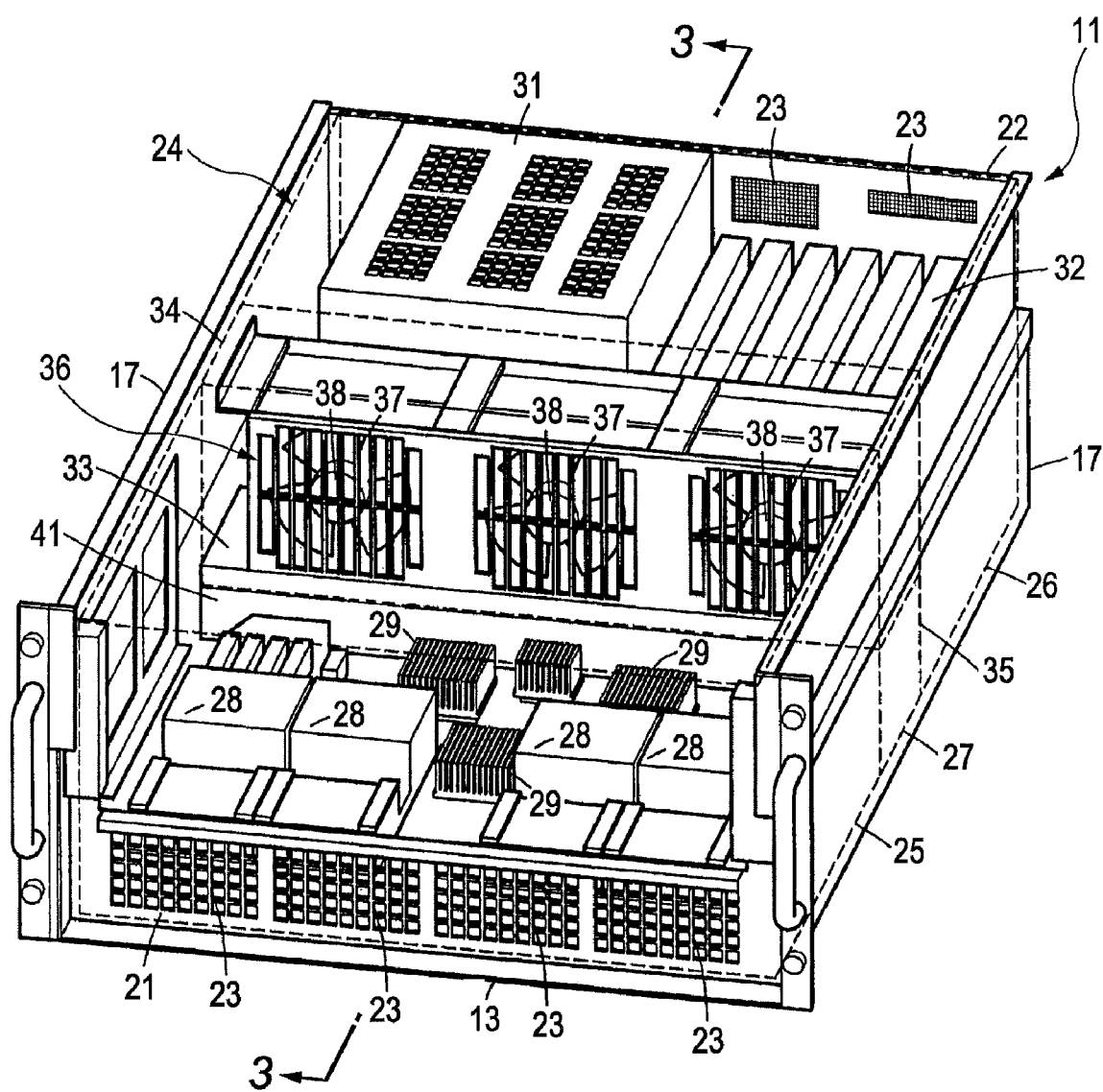
FIG. 2 is a perspective view schematically depicting an inner structure of the computer device.

The front-side opening 14 is covered with a front panel 21. As depicted in FIG. 2, the rear-side opening 15 is covered with a rear panel 22. Grilled windows 23 for air supply and exhaust are formed in the front panel 21 and the rear panel 22.

A rectangular-solid first space 25 is formed adjacent to the front-side opening 14 in a rectangular-solid space 24. Similarly, a second space 26 is formed adjacent to the rear-side opening 15 in the rectangular-solid space 24. A third space 27 is blocked out between the first space 25 and the second space 26. The third space 27 is sandwiched between the first space 25 and the second space 26. That is, the rectangular-solid space 24 is sequentially partitioned from the front face by the first space 25, the third space 27, and the second space 26.

Electronic parts having relatively low profiles are accommodated in the first space 25. Examples of the low-profile electronic parts include a CPU (Central Processing Unit) chip package 28 and a controller chip package 29. For example, the CPU chip package 28 and the controller chip package 29 include heat sinks. For example, the heat sink includes plural cooling fins. Each cooling fin is extended in parallel with the side face of the rectangular-solid space 24. For example, a memory module group 31 and a PCI (Peripheral Component Interconnect) card group 32 are accommodated in the second space 26.

In the third space 27, a tray 33 is disposed between the side plates 17. The tray 33 extends from one of the side plates 17 to the other side plate 17 in parallel with the bottom surface of the rectangular-solid space 24. Both ends of the tray 33 are fixed to the side plates 17, respectively. The tray 33 is fixed to the side plates 17 with rivets. The tray 33 partitions the third space 27 into an upper-side first small space 34 and a lower-side second small space 35.

A fan unit 36 is disposed in the first small space 34. The fan unit 36 is mounted on the tray 33. The fan unit 36 occupies the first small space 34. The fan unit 36 partitions the first space 25 and the second space 26 on the upper side of the third space 27. The fan unit 36 includes plural axial flow fans 37. Each axial flow fan 37 is rotated about a rotation shaft 38 extended in parallel with the bottom surface of the rectangular-solid space 24. At this point, double-axial flow fans 37 having coaxial rotation shafts 38 are disposed in three lines. The six axial flow fans 37 are mutually coupled. The air flow is produced from the first space 25 toward the second space 26 according to the rotation of the fan, thereby producing the air flow in the hollow from the front-side opening 14 toward the rear-side opening 15.

Figure 3:
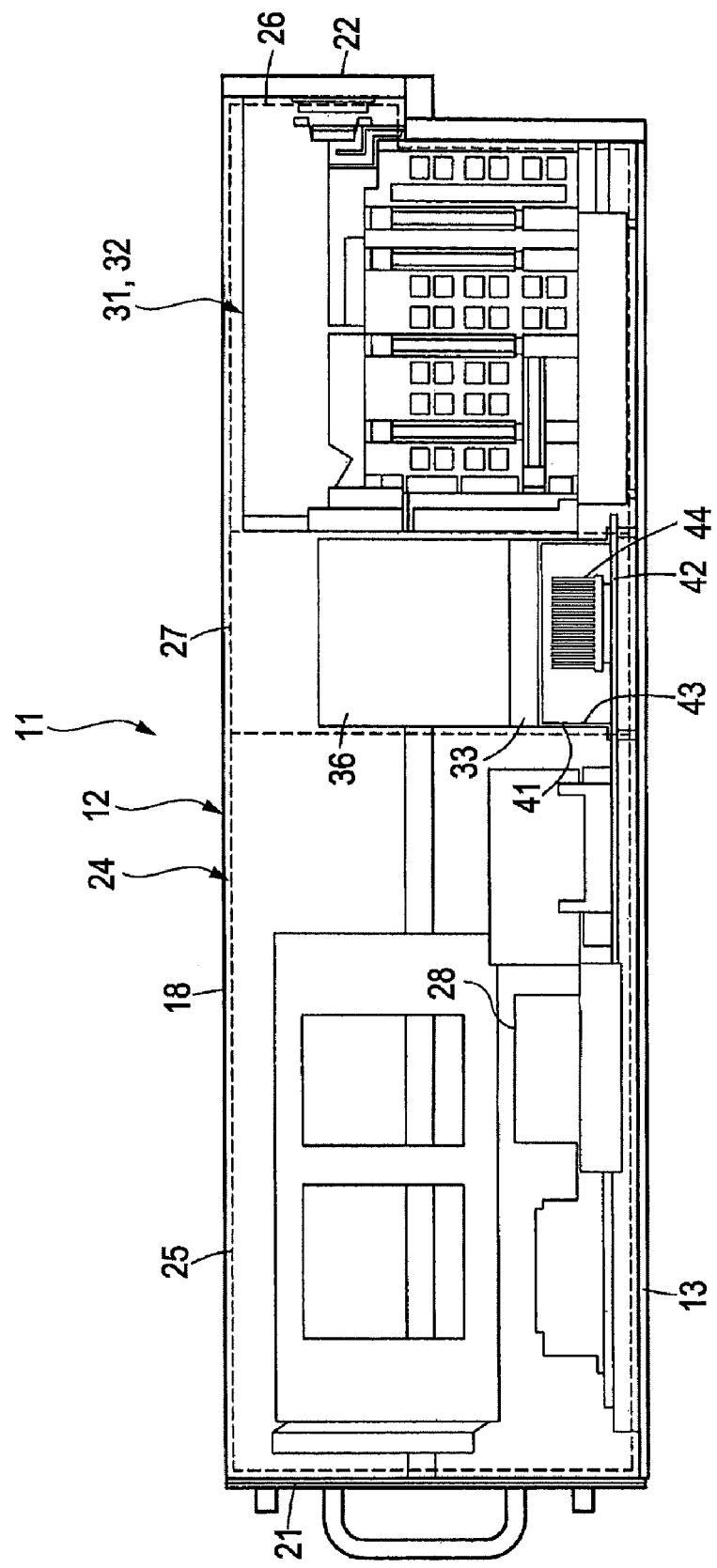
FIG. 3 is a vertical sectional view taken along a line 3-3 of FIG. 2.

An air duct member 41 is disposed in the second small space 35. The air duct member 41 occupies the second small space 35. The air duct member 41 partitions the first space 25 and the second space 26 on the lower side of the third space 27. As depicted in FIG. 3, the air duct member 41 is mounted on a printed circuit board 42. A flow passage 43 is formed between the air duct member 41 and the printed circuit board 42. The printed circuit board 42 extends from the first space 25 to the second space 26 while traversing the third space 27 in the chassis 12. It is preferable that the printed circuit board 42 be extended in parallel with the bottom surface of the rectangular-solid space 24. The CPU chip package 28 and the controller chip package 29 are mounted on the printed circuit board 42. Similarly, the memory module group 31 and the PCI card group 32 are mounted on the printed circuit board 42.

In the third space 27, electronic parts are mounted on the surface of the printed circuit board 42. The electronic parts include predetermined semiconductor chip packages 44. The semiconductor chip package 44 has a heat release value that is equal to or lower than that of the CPU chip package 28 or controller chip package 29. For example, the semiconductor chip package 44 includes the heat sink. For example, the heat sink includes plural cooling fins. Each cooling fin is extended in parallel with the front or rear of the rectangular-solid space 24.

Figure 4:
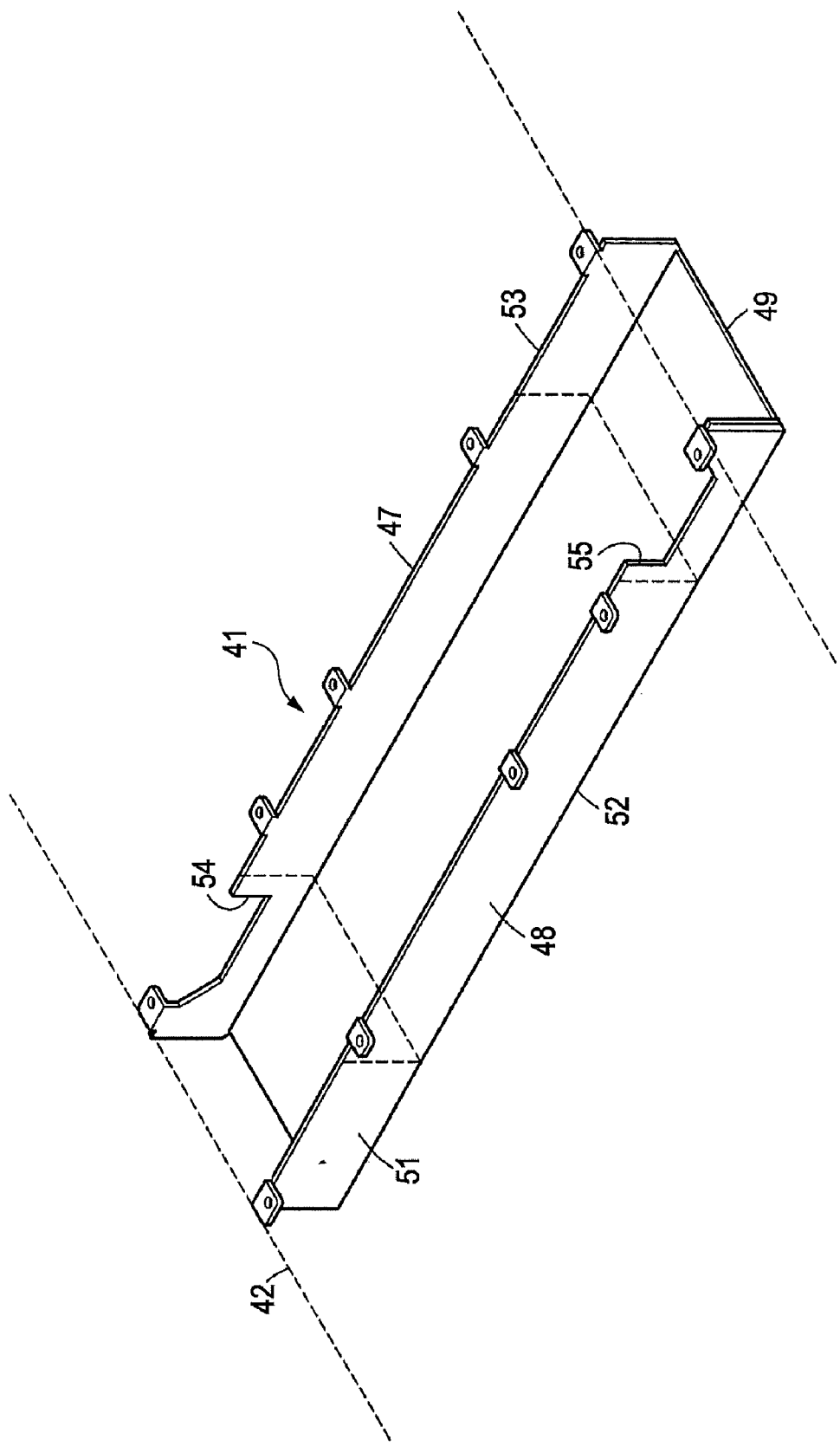
FIG. 4 is an enlarged perspective view of an air duct member.
Figure 5:
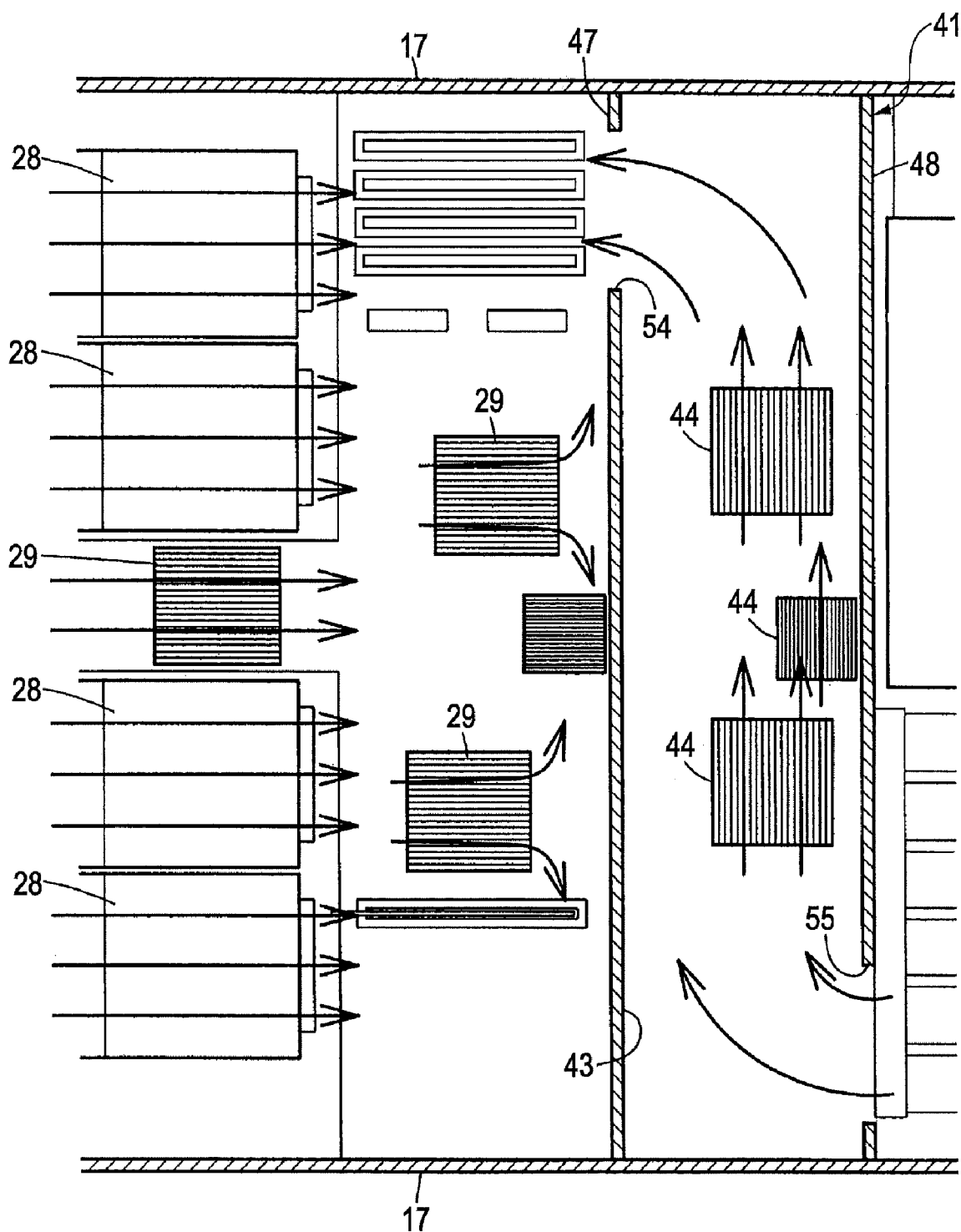
FIG. 5 is a partially enlarged plan view schematically depicting an air flow on a printed circuit board.

As depicted in FIG. 4, the air duct member 41 includes a first sidewall 47. The first sidewall 47 rises from the surface of the printed circuit board 42, and the first sidewall 47 extends along a boundary surface between the first space 25 and the third space 27. That is, the first sidewall 47 partitions the first space 25 and the second small space 35. Similarly the air duct member 41 includes a second sidewall 48. The second sidewall 48 rises from the surface of the printed circuit board 42, and the second sidewall 48 extends along a boundary surface between the second space 26 and the third space 27. That is, the second sidewall 48 partitions the second small space 35 and the second space 26. An upper end of the first sidewall 47 and an upper end of the second sidewall 48 are connected to each other by a ceiling plate 49. That is, similar to the tray 33, the ceiling plate 49 partitions the first small space 34 and the second small space 35. The ceiling plate 49 extends from the upper end of the first sidewall 47 to the upper end of the second sidewall 48. The first sidewall 47, the second sidewall 48, and the ceiling plate 49 traverse the printed circuit board 42.

The first sidewall 47, the second sidewall 48, and the ceiling plate 49 are formed by, for example, one plate member. The plate member is made of stainless steel. The first sidewall 47, the second sidewall 48, and the ceiling plate 49 are divided from one end to the other end into a first divided region 51, a second divided region 52, and a third divided region 53. In the first divided region 51, the exhaust port 54 is formed in the first sidewall 47. The exhaust port 54 is formed based on cooperation with a notch formed in an edge of the plate member and the printed circuit board 42. In the third divided region 53, an intake port 55 is formed in the second sidewall 48. Similarly, the intake port 55 is formed based on cooperation with a notch partitioned in an edge of the plate member and the printed circuit board 42. As a result, a flow passage from the intake port 55 to the exhaust port 54 passes through the third divided region 53, the second divided region 52, and the first divided region 51. The flow passage is extended in parallel with the front face of the rectangular-solid space 24 and traverses the printed circuit board 42.

When the axial flow fan 37 is started up, as depicted in FIG. 2, the air flow is produced from the first space 25 toward the second space 26. The heat sinks of the CPU chip package 28 and the controller chip package 29 are exposed to the air flow. The air flow deprives the heat sink of the heat. Thus, the CPU chip package 28 and the controller chip package 29 are cooled, so that a temperature rise is restrained in the CPU chip package 28 and the controller chip package 29.

A pressure in the first space 25 is reduced according to the operation of the axial flow fan 37. At the same time, a pressure in the second space 26 is increased. The increase in pressure of the second space 26 is released through the grilled window 23 of the rear panel 22 or the intake port 55 of the air duct member 41. That is, in the air duct member 41, the air flow is produced from the intake port 55 toward the exhaust port 54. The air flow is produced along the flow passage in the air duct member 41. The heat sink of the semiconductor chip package 44 is exposed to the air flow. The air flow deprives the heat sink of the heat. The semiconductor chip package 44 disposed in the flow passage 43 in the air duct member 41 is cooled, so that a temperature rise is restrained in the semiconductor chip package 44.

In the computer device 11, the second small space 35 is ensured between the fan unit 36 and the printed circuit board 42. In the second small space 35, electronic parts such as the semiconductor chip package 44 are mounted on the printed circuit board 42. The area where the electronic parts are mounted is not reduced irrespective of the disposition of the fan unit 36. The area where the electronic parts are mounted on the printed circuit board 42 is effectively used. Additionally, the electronic parts are exposed to the air flow although the electronic parts are disposed between the fan unit 36 and the printed circuit board 41, so that a temperature rise is restrained in the electronic parts.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A cooling device, comprising:
   a chassis that partitions a first space, a second space, and a third space sandwiched between the first space and the second space;
   a printed circuit board accommodated in the chassis that extends from the first space to the second space while traversing the third space;
   a fan occupying the third space outside a predetermined space that produces an air flow from the first space toward the second space by rotation of a rotor blade, wherein the predetermined space is ensured between the printed circuit board and the fan in the third space; and
   an air duct member that occupies the predetermined space to form a flow passage of the air flow from an intake port to an exhaust port on the printed circuit board,
   wherein the intake port is opened to the second space and the exhaust port is opened to the first space.

2. The cooling device according to claim 1, further comprising:
   a first sidewall rising from a surface of the printed circuit board to be extended along a boundary surface between the first space and the predetermined space that forms the exhaust port;
   a second sidewall rising from the surface of the printed circuit board to be extended along a boundary surface between the second space and the predetermined space that forms the intake port; and a ceiling plate that extends along a virtual plane from an upper end of the first sidewall to an upper end of the second sidewall, wherein the virtual plane forms the predetermined space in the third space.

3. The cooling device according to claim 2, wherein the first sidewall, the second sidewall and the ceiling plate are divided from one end toward the other end into a first divided region, a second divided region and a third divided region, the exhaust port is formed in the first sidewall of the first divided region, and the intake port is formed in the second sidewall of the third divided region.

4. The cooling device according to claim 1, wherein the air flow cools electronic parts generating heat in the third space while the electronic parts are mounted on the printed circuit board.

5. The cooling device according to claim 1, wherein the fan is an axial flow fan including the rotor blade, the rotor blade rotating around a rotation axis extended in parallel with a surface of the printed circuit board.

* * * * *